United States Patent [19]

Pfiester et al.

[11] Patent Number: 5,348,903
[45] Date of Patent: Sep. 20, 1994

[54] PROCESS FOR FABRICATING A SEMICONDUCTOR MEMORY CELL HAVING THIN-FILM DRIVER TRANSISTORS OVERLAPPING DUAL WORDLINES

[75] Inventors: James R. Pfiester; James D. Hayden, both of Austin, Tex.

[73] Assignee: Motorola Inc., Schaumburg, Ill.

[21] Appl. No.: 940,143

[22] Filed: Sep. 3, 1992

[51] Int. Cl.$^5$ .................... H01L 21/70; H01L 27/00
[52] U.S. Cl. ........................................ 437/52; 437/40; 437/101; 437/193
[58] Field of Search ................. 437/47, 52, 60, 48, 437/101; 257/903–904, 379–381

[56] References Cited

U.S. PATENT DOCUMENTS

| 5,034,797 | 7/1991 | Yamanaka et al. | 257/69 |
| 5,145,799 | 9/1992 | Rodder | 437/47 |
| 5,173,754 | 12/1992 | Manning | 257/69 |

FOREIGN PATENT DOCUMENTS 1-166554  6/1989  Japan .

OTHER PUBLICATIONS

H. Kuriyama, et al., "An Asymmetric Memory Cell Using a C-TFT for ULSI SRAMs", 1992 Symposium on VLSI Technology Digest of Technical Papers, pp. 38–39, 1992.

K. Itabashi, et al., "A Split Wordline Cell For 16Mb SRAM Using Polysilicon Sidewall Contacts", IEEE Proc. Int. Electron Dev. Meeting, pp. 477–480, Dec. 1991, Washington D.C.

H. Ohkubo, et al., "16Mbit SRAM Cell Technologies for 2.0V Operation", IEEE Proc. Int. Electron Dev. Meeting, pp. 481–484 Dec. 1991, Washington D.C.

Primary Examiner—Olik Chaudhuri
Assistant Examiner—H. Jey Tsai
Attorney, Agent, or Firm—Jasper W. Dockrey

[57] ABSTRACT

A semiconductor memory cell (10) includes first and second cross-coupled driver transistors (13, 19) each having a source-drain region and a channel region formed in a first thin-film layer (36, 36'). First and second parallel opposed wordlines (20, 22) overlie a single-crystal semiconductor substrate (12) and the channel region (46) of each driver transistor overlies a portion of an adjacent wordline. A portion of the thin-film layer (36, 36') makes contact to the single-crystal semiconductor substrate (12) adjacent to the opposite wordline. The channel and source-drain regions of first and second load transistors (15, 21) are formed in a second thin-film layer (64) which overlies the driver transistors (13, 19). The load transistors (15, 21) are cross-coupled to the driver transistors (13, 19) through common nodes (31, 33).

12 Claims, 4 Drawing Sheets

PROCESS FOR FABRICATING A SEMICONDUCTOR MEMORY CELL HAVING THIN-FILM DRIVER TRANSISTORS OVERLAPPING DUAL WORDLINES

RELATED APPLICATION

Related subject matter is disclosed in co-pending, commonly assigned patent application Ser. No. 07/979,512, filed on Jul. 6, 1992.

FIELD OF THE INVENTION

This invention relates in general to semiconductor devices and processes for their fabrication, and more particularly to a semiconductor memory cell and a process for fabricating the memory cell.

BACKGROUND OF THE INVENTION

As semiconductor devices become smaller, it becomes necessary to arrange individual components within a device such that minimal separation distances are achieved. The need to design compact component arrangements occurs most significantly in memory devices. Because of the large number of components needed to fabricate a typical dynamic-random-access-memory device (DRAM) or static-random-access-memory device (SRAM), the components must be arranged compactly if the overall device dimensions are not to become excessively large. This problem is especially critical in SRAM devices where a typical individual memory cell contains as many as six separate components.

One technique to reduce SRAM memory cell dimensions is to split the wordline over the cell. The wordline controls read and write functions to the cell by turning the pass transistors on and off. By splitting the word line into two separate lines, a more symmetrical cell layout is possible. However, even with a split wordline memory cell design, a need remains to further reduce the overall cell dimensions. Although split wordline designs reduce the area of the cell, fundamental manufacturing limitations remain. Active surface regions of the cell must be made available for the interconnection of leads providing supply and ground voltages to the cell. In addition, active surface area must be available for the formation of driver transistors and pass transistors providing read and write functions for the cell. Simple downsizing of components can only be pursued to the limit of the line-width definition capability of the manufacturing process. Once the line-width definition limits are reached, new design methodology must be employed if further reduction in memory cell area is to be achieved.

Another technique for fabricating a memory cell having a small surface area is to stack MOS transistors in a vertical arrangement. Typically, a driver transistor is formed in the substrate having source, drain, and channel regions in the substrate and a gate electrode overlying the substrate surface. Then, a second transistor is formed in a thin-film layer overlying the first transistor. By adding an additional electrical component to the device, the thin-film transistor increases the functional capacity of a device while not consuming additional surface area or requiring further downsizing of components.

While thin-film transistors remain a useful design alternative for the formation of compact devices, they usually exhibit poor performance. Thin-film transistors are most often formed in an amorphous or polycrystalline material which does not conduct charge as well as a single-crystal silicon substrate. Therefore, the use of thin-film transistors in memory devices has been limited to either load resistor functions, or to asymmetrical SRAM cells. Because each driver transistor in the asymmetric SRAM cell has a different current handling capability, the asymmetric SRAM has unmatched inverter characteristics. However, in either the conventional SRAM cell or the asymmetric SRAM cell, valuable substrate surface area is used for the formation of high-performance driver transistors, and the like. The prior art practice of placing at least one driver transistor in the substrate limits the further downsizing of semiconductor memory cells.

SUMMARY OF THE INVENTION

In practicing the present invention there is provided a semiconductor memory cell and process for fabricating the cell. In one embodiment, a semiconductor memory cell includes a single-crystal semiconductor substrate having first and second parallel opposed wordlines formed thereon. First and second cross-coupled driver transistors overlie the first and second wordlines respectively. Each driver transistor includes a thin-film layer having a source-drain region and a channel region formed therein. The channel region of each driver transistor overlies a portion of the wordline and a portion of the thin film-layer contacts the single-crystal substrate. A substantial savings in substrate surface area is realized by fabricating the driver transistors in a thin-film layer overlying the wordlines.

In one embodiment, a process for fabricating the thin-film layer includes providing a single-crystal silicon substrate and forming a single-crystal silicon layer having a source-drain region and a channel region formed therein. The single-crystal silicon layer is fabricated by depositing a polysilicon layer overlying the wordlines and contacting a portion of the substrate. The polysilicon layer is annealed to recrystallize the polysilicon using the contacted portion of the single-crystal silicon substrate as a nucleation site for the recrystallization process.

BRIEF DESCRIPTION OF THE DRAWINGS

FIGS. 2, 3, 4, 5-1, 6-1 and 7, illustrate, in cross-section, process steps in accordance with the invention;

FIG. 5-2 is a plan view of the memory cell according to the invention illustrated in FIG. 5-1; and FIG. 6-2 is a plan view of the memory cell according to the invention illustrated in FIG. 6-1.

Figure 1:
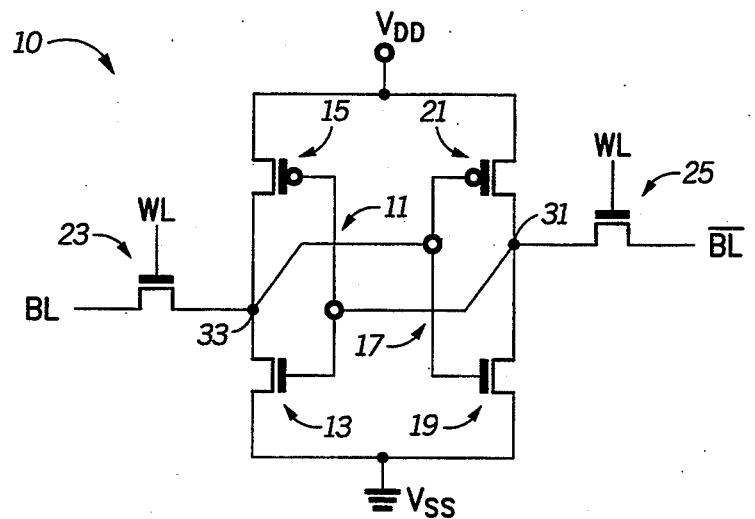
FIG. 1 is a schematic circuit diagram of an SRAM memory cell.

It will be appreciated that for simplicity and clarity of illustration elements shown in the FIGURES have not necessarily been drawn to scale. For example, the dimensions of some of the elements are exaggerated relative to each other for clarity. Further, where considered appropriate, reference numerals have been repeated among the FIGURES to indicate corresponding elements.

DETAILED DESCRIPTION OF PREFERRED EMBODIMENTS

Shown in FIG. 1 is a conventional circuit diagram of a static RAM cell 10 comprised of a first inverter 11 including a driver transistor 13 and a load transistor 15, a second inverter 17 including a driver transistor 19 and a load transistor 21, a pass transistor 23 and a pass transistor 25. Pass transistors 23 and 25 permit access of data bit-line signals (designated BL) to and from memory cell 10. The inverters 11 and 17 are cross-coupled to each other at nodes 31 and 33. Pass transistors 23 and 25 are controlled by split wordlines WL, which carry signals enabling memory cell 10 to transmit data to and from the bit-lines BL. Supply voltage $V_{DD}$ is connected to transistors 15 and 21 and a ground signal $V_{SS}$ is provided to transistors 13 and 19.

Shown in FIGS. 2-7, in accordance with the invention, are cross-sectional and plan views of transistors 13, 15, and 23, and node 33 at various stages of completion during the fabrication process. Those skilled in the art recognize that memory cell 10 is inversely symmetrical with respect to the structures illustrated, and that, although only structures formed in one side of the memory cell 10 are depicted in the cross-sectional views illustrated in FIGS. 2 through 7, corresponding structures are also formed concurrently in another portion of memory cell 10. For purposes of illustration, the invention is described with reference to the manufacture of N-channel driver and pass transistors, and P-channel load transistors. Those skilled in the art also recognize that the conductivity of the transistors can be reversed for specific applications. Furthermore, the figures illustrate the fabrication of one memory cell in a semiconductor device. In the fabrication of an actual integrated circuit, the illustrated memory cell may be repeated many times for each integrated circuit.

Figure 2:
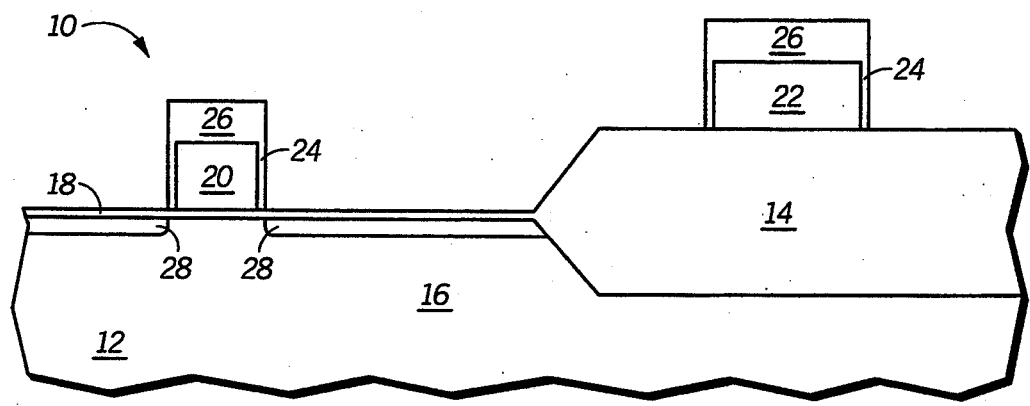

Shown in FIG. 2, in cross section, is a portion of a memory cell 10 having already undergone some of the process steps in accordance with the invention. A semiconductor substrate 12, of P-type conductivity, has an isolation region 14 and an active region 16. A first dielectric layer 18 overlies active region 16 and a first wordline 20 overlies first dielectric layer 18. A second wordline 22 overlies isolation region 14. Both first and second wordlines 20 and 22 are insulated by a sidewall insulation layer 24 and by a first insulation cap 26. A lightly-doped, N-type, source-drain region 28 is formed in active region 16 on either side of first wordline 20. In one embodiment, semiconductor substrate 12 is single-crystal silicon. However, semiconductor substrate 12 can be another single-crystal semiconductor material such as gallium arsenide, germanium, or germanium-silicon.

In the case of a silicon substrate, dielectric layer 24 is preferably silicon dioxide formed by thermal oxidation of substrate 12. However, dielectric layer 24 can be a silicon nitride layer, an oxynitride layer, a composite nitride-oxide layer, and the like. The wordlines and the associated insulation layers are formed by the blanket deposition of an N-type silicon material, followed by the blanket deposition of an electrically insulating material. After deposition, a photolithographic pattern is formed on the insulating material and both layers are anisotropically etched. Next, the photolithographic pattern is removed and oxidation process is performed to grow a thin insulating layer on the sidewall of wordlines 20 and 22. In a preferred embodiment, wordlines 20 and 22 are formed by doped polysilicon and first insulation cap 26 is silicon oxide. Alternatively, wordlines 20 and 22 can be a polysilicon-refractory metal silicide composite material and insulation cap 26 can be silicon nitride. Lightly-doped, source-drain region 28 is formed by ion implantation of an N-type dopant, such as phosphorus or arsenic, into active region 16 using wordline 20 as a doping mask.

Figure 3:
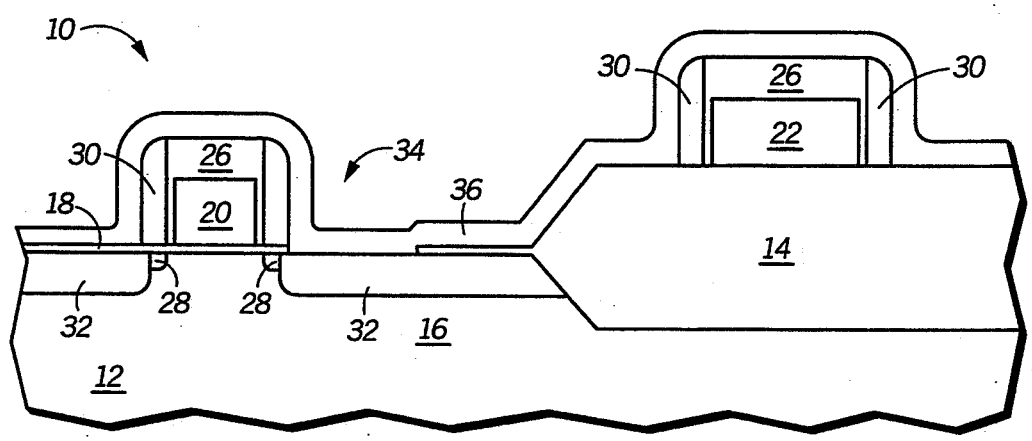

Following the formation of wordlines 20 and 22, sidewall spacers 30 are formed on the wordlines, as shown in FIG. 3. A conformal deposition and subsequent anisotropic etching of an insulating material such as silicon oxide or silicon nitride is used to form the sidewall spacers. Once sidewall spacers 30 are in place, a heavily doped, N-type source-drain region 32 is formed by ion implantation of an N-type dopant into active region 16 using sidewall spacers 30 as a doping mask. First dielectric layer 18 is photolithographically patterned and subsequently etched to form a contact opening 34 which exposes a portion of the surface of active region 16.

In accordance with the invention, a first thin-film layer 36 is formed which makes contact to the substrate through opening 34 and overlies first wordlines 20 and 22. Preferably, first thin-film layer 36 is formed by deposition of an amorphous silicon material, followed by thermal annealing to recrystallize the amorphous silicon into single-crystalline silicon material. Alternatively, a polycrystalline silicon (polysilicon) material can be deposited and recrystallized. During recrystallization, the portion of the single-crystal surface of substrate 12 exposed by opening 34 provides a nucleation site for the propagation of a crystalline lattice into first thin-film layer 36. The recrystallization process forms regions of single-crystal silicon in first thin-film layer 36. The regions are concentrated in the vicinity of opening 34, but in all cases extend through the portion of thin-film layer 36 overlying wordline 22. To enhance the transformation of the amorphous silicon or polysilicon to a single-crystal material, first thin-film layer 36 can be doped with either silicon (Si) or germanium (Ge) atoms by ion implantation prior to annealing. In an alternative annealing method, the polysilicon material is recrystallized by exposure to a coherent light source such as a pulsed laser.

In another alternative method, first thin-film layer 36 is formed by epitaxial growth using the exposed portion of substrate 12 as a nucleation site for the epitaxial growth of a single-crystal silicon layer. The growth occurs in both a vertical and a lateral direction thereby covering a substantial portion of the surface of substrate 12. After epitaxial growth, an etch back process is used to remove surface portions of the epitaxial layer until an acceptable thickness is obtained.

Figure 4:
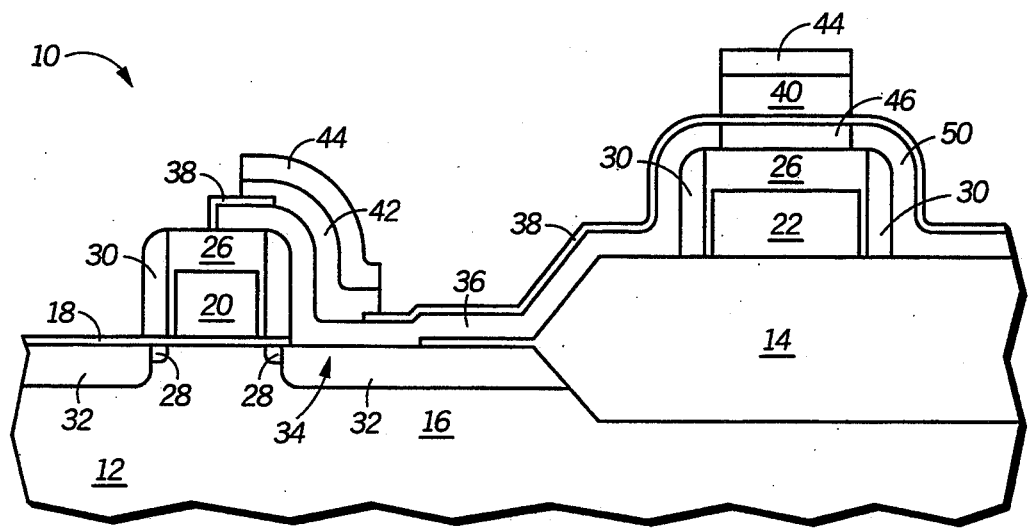

Following the formation of first thin-film layer 36, the layer is patterned and etched to define a conductive body, as shown in FIG. 4. After etching, first thin-film layer 36 is oxidized to form a second dielectric layer 38. An ion implant step is performed to dope first thin-film layer 36 with a P-type dopant. Next, a portion of second dielectric layer 38 is etched away to expose an underlying portion of first thin-film layer 36. The exposed portion of first thin-film layer 36 also overlies the portion of substrate 12 exposed by contact opening 34. A polysilicon layer and an insulation layer are deposited, patterned, and anisotropically etched to form a driver-gate electrode 40, and a gate extension 42, with each protected by a second insulation cap 44. The polysilicon layer is doped with an N-type dopant either during deposition, or after deposition. An ion implant step is carried out to lightly-dope first thin-film layer 36 with an N-type dopant using driver-gate electrode 40 as an implant mask. Portions of first thin-film layer 36 exposed outside of driver-gate electrode 40 is counterdoped by the ion implant step to change the conductivity of the exposed portion from P-type to N-type. Subsequent thermal cycles cause the lightly doped regions to diffuse partly under the driver-gate electrode 40. A portion of first thin-film layer 36 underlying driver-gate electrode 40 includes a P-type channel region 46.

Figures 1, 5:
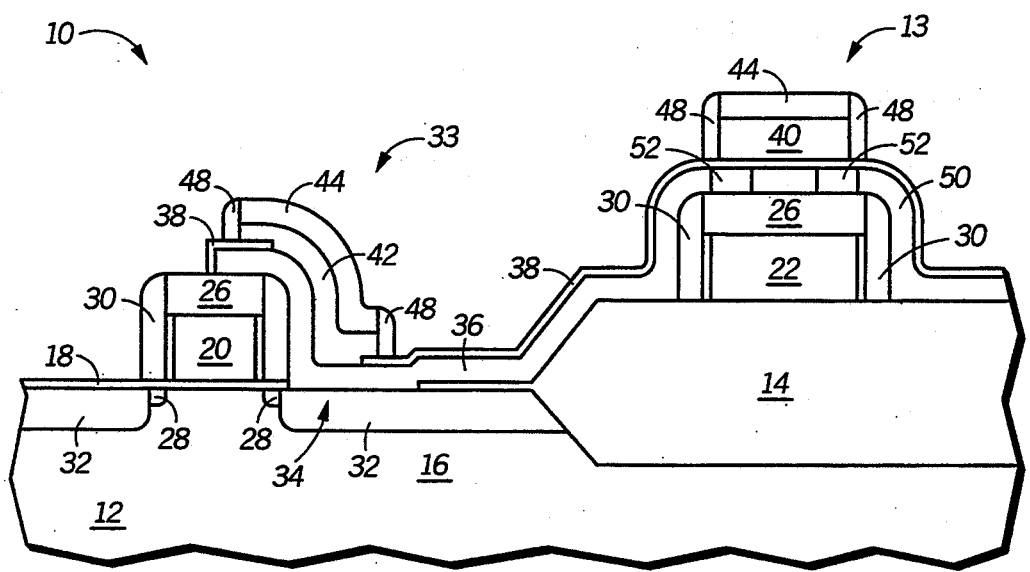
Figures 2, 5:
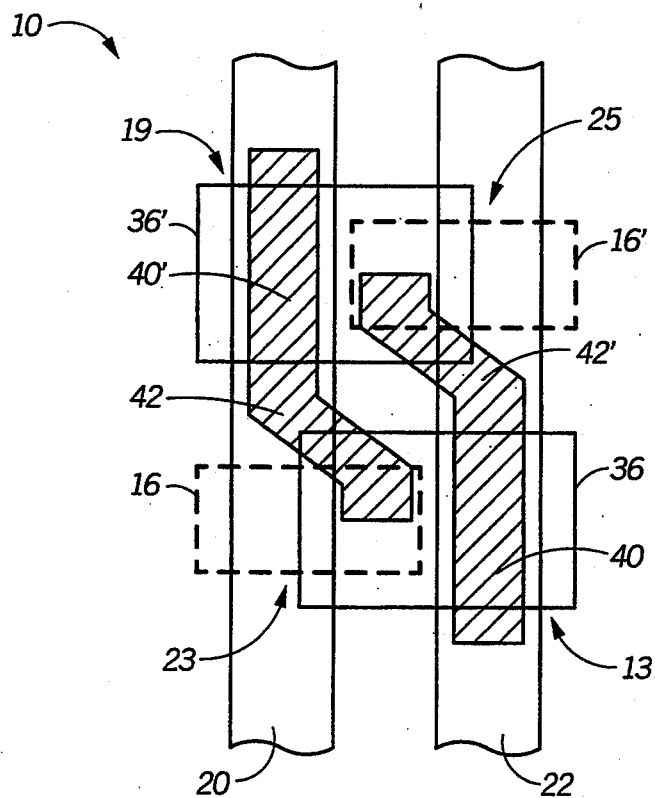

After defining channel region 46, an insulating layer is conformally deposited and anisotropically etched to form a sidewall spacer 48 on gate electrode 40 and gate extension 42, as shown in FIG. 5-1. Sidewall spacer 48 is used as a doping mask for the formation of a heavily-doped, N-type, source-drain region 50 in first thin-film layer 36. After the implant step, a lightly-doped, N-type, source-drain regions 51 remain in first thin-film layer 36 and underlie sidewall spacers 48 on opposing sides of driver-gate electrode 40.

At this point in the fabrication process, pass transistor 23 are formed in substrate 12, and driver transistor 13 are formed overlying wordline 22. As illustrated in FIG. 5-1, pass transistor 23 includes a gate electrode, formed by a portion of wordline 20 overlying active region 16, and lightly-doped and heavily-doped source-drain regions 28 and 32 residing in active region 16 on either side of wordline 20. Driver transistor 13, includes driver-gate electrode 40, overlying channel region 46, and lightly-doped and heavily-doped source-drain regions 52 and 50, respectively, residing in first thin-film layer 36 on opposite sides of driver-gate electrode 40.

The channel region of driver transistor 13 is preferably formed by the recrystallization technique described above. The recrystallization technique forms a single-crystal silicon layer which can be doped to obtain a low electrical resistance. A low electrical resistance material is preferred for the formation a high-performance MOS transistor. For example, transistor performance parameters such as current gain and switching speed all depend on the low electrical resistance of the source-drain and channel regions when the transistor is on. However, in applications where high-performance is not as important, the source-drain and channel regions may be formed of a polysilicon material. Therefore, it is within the scope of the invention to deposit a polysilicon layer, as layer 36, and dope the polysilicon to the desired conductivity. In the alternate embodiment, driver transistor 13 is a thin-film transistor having a polysilicon channel region and can be used as a load device, or for another application not requiring high performance capability.

FIG. 5-2 illustrates, in plan view, memory cell 10 as it appears at this stage in the fabrication process. The plan view illustrates the arrangement of pass transistors 23 and 25 and driver transistors 13 and 19 in relation to wordlines 20 and 22. As depicted in the plan view, the cell is symmetrical and corresponding pass transistor 25 is formed in active area 16' located on the opposite side of memory cell 10. First thin-film layer 36 is shown extending across active region 16 and over wordline 22. Correspondingly, first thin-film layer 36' extends over wordline 20 on the opposite side of memory cell 10. One important feature of the invention is the formation of driver transistors 13 and 19 in a thin-film layer (first thin-film layer 36 and 36') overlying wordlines 20 and 22. By forming the driver transistors over the wordlines, the substrate area occupied by the memory cell can be reduced as compared to a conventional cell. In accordance with the invention, the wordlines are brought close together because substrate area is not required for the formation of driver transistors in the portion of the substrate between the wordlines. As illustrated in FIG. 5-2, the alternating overlap of first thin-film layers 36 and 36' enables the gate electrodes for driver transistors 13 and 19 to make contact to the substrate in the region between wordlines 20 and 22.

Figures 1, 6:
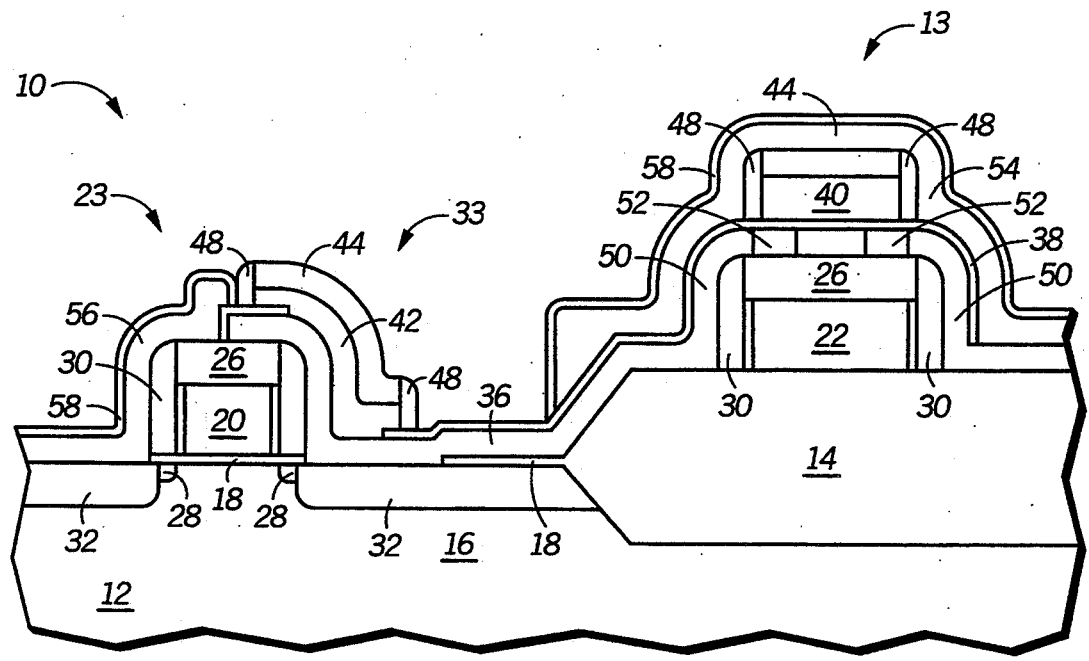
Figures 2, 6:
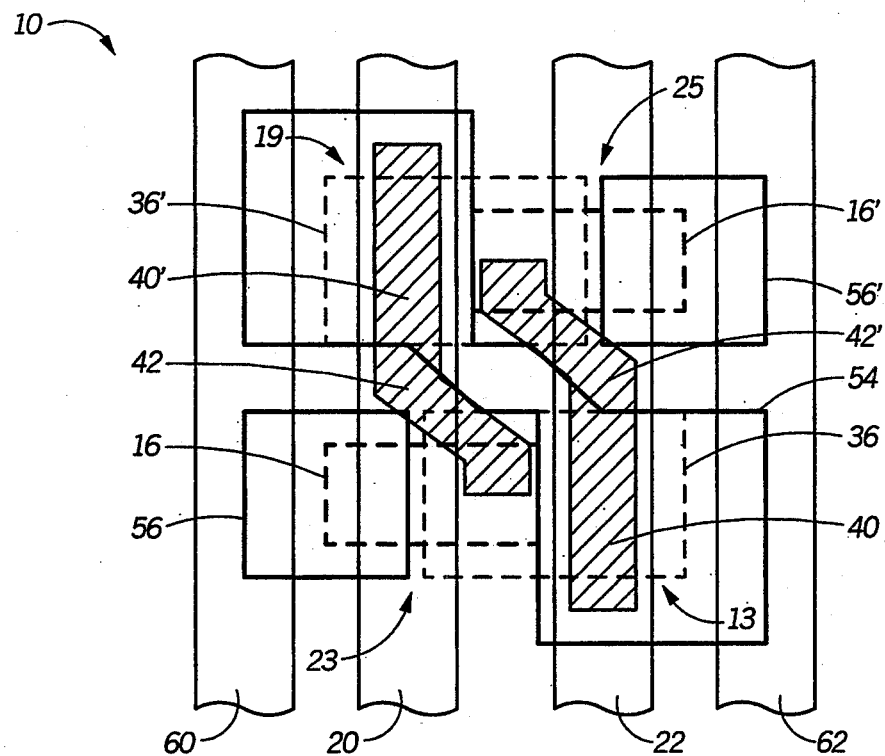

In accordance with the invention, a $V_{SS}$ interconnect layer 54 and a bit-line interconnect layer 56 are formed, as illustrated in FIG. 6-1. $V_{SS}$ interconnect layer 54 makes contact to source-drain region 50 of driver transistor 13 and extends over driver-gate electrode 40. Bit-line interconnect layer 56 makes contact to source-drain region 32 of pass transistor 23 and extends over a portion of wordline 20. Prior to forming interconnect layers 54 and 56, a portion of first dielectric layer 18 overlying source-drain region 32 and a portion of second dielectric layer 38 overlying source-drain region 50 are etched away. Preferably, interconnect layers 54 and 56 are then formed by blanket deposition of a single layer of polysilicon. The polysilicon layer is doped N-type to a desired resistivity either during deposition, or afterward. Following deposition, the polysilicon layer is photolithographically patterned, then etched to form interconnect layers 54 and 56. Once patterning is complete, the photolithographic pattern is removed and an oxidation process is carried out to form a protective insulation layer 58 overlying the interconnect layers. In an alternative method, insulation layer 58 can be formed by the deposition of a dielectric material, such as low-temperature silicon oxide, silicon nitride, an oxynitride, or the like, over the blanket polysilicon layer. After deposition, the insulation layer is photolithographically patterned and a composite etch is used to remove unmasked portions of the insulation layer and the polysilicon layer.

$V_{SS}$ and bit-line interconnect layers 54 and 56 extend over a substantial area of memory cell 10 and provide a contact region to which overlying bit-line and $V_{SS}$ signal lines can be coupled. The full, lateral extent of $V_{SS}$ and bit-line interconnect layers 54 and 56 over memory cell 10 is illustrated, in plan view, in FIG. 6-2. In addition to overlying wordlines 20 and 22, interconnect layers 54 and 56 also overlie wordlines 60 and 62 which are adjacent to memory cell 10. Wordlines 60 and 62 provide wordline signals to memory cells adjacent to memory cell 10. For simplicity, the remaining components of the adjacent memory cells are not shown in FIG. 6-2. By contacting the source-drain areas of driver transistors 13 and 19, and extending across both wordlines 20 and 22, interconnect layer 54 provides a means for introducing a $V_{SS}$ signal to both sides of memory cell 10. Bit-line interconnect layer 56 is sectioned into two regions, 56 and 56', to provide a bit-line connection to pass transistors 23 and 25. Both sections 56 and 56' also overlap a portion of adjacent wordlines 60 and 62, respectively, and provide an expanded contact region for contact by an overlying bit-line lead (not shown).

Figure 7:
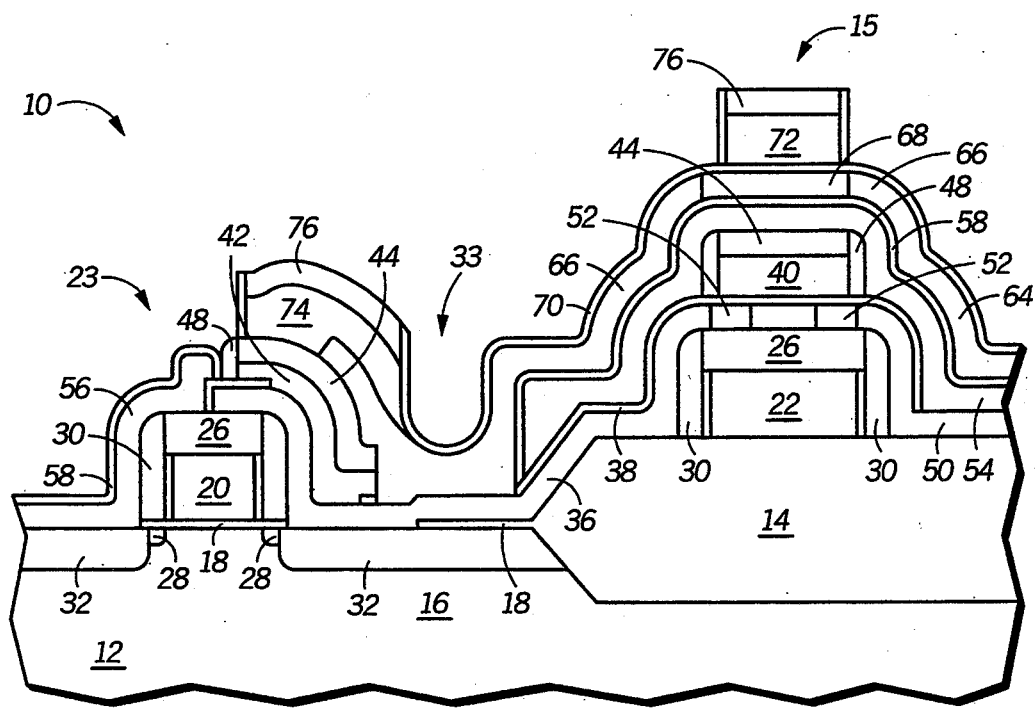

The process in accordance with the invention continues with the formation of a second thin-film layer 64 overlying insulation layer 58, source-drain region 50, and a portion of gate extension 42, as shown in FIG. 7. Prior to the formation of the second thin-film layer 64, a portion of second dielectric layer 38 overlying source-drain region 50 of driver transistor 23 is removed. Preferably, second thin-film layer 64 is polysilicon formed by chemical vapor deposition. In alternate embodiments, the second thin-film layer may be formed using materials listed with respect to the first thin-film layer 36. The polysilicon is either deposited as doped N-type polysilicon (insitu doped), or is deposited undoped and subsequently doped with an N-type impurity dopant such as phosphorus or arsenic. Next, second thin-film 64 layer is photolithographically patterned and a P-type dopant is implanted to form P-type source-drain regions 66. The implant also defines an N-type channel region 68 intermediate to P-type source-drain regions 66.

After the deposition and doping of second thin-film layer 64, a third dielectric layer 70 is formed overlying second thin-film layer 64. Preferably, third dielectric layer 70 is formed by thermal oxidation of second thin-film layer 64. Following the oxidation process, a photolithographic pattern is formed on third dielectric layer 70 and the composite dielectric layer and second thin-film layer 64 are etched to define the source-drain regions and channel regions of load transistors 15 and 21.

Once source-drain and channel regions have been formed in second thin-film layer 64, a load-gate electrode 72 is formed overlying third gate dielectric layer 66 and aligned to one side of channel region 68. A second gate extension 74 is also formed overlying source-drain region 66. Both load-gate electrode 72 and second gate extension 74 are protected by a third insulation cap 76. Load-gate electrode 72 and second gate extension 74 are formed by blanket depositing an N-type polysilicon layer overlying third gate dielectric layer 70. Alternatively, a P-type polysilicon layer can be deposited to match the conductivity of load-gate electrode 72 to that of the underlying channel region. Prior to deposition of the polysilicon layer, an opening is formed in third dielectric layer 70 and second insulation cap 44 so that an electrical connection can be formed between second gate extension 74 and source-drain region 66 and first gate extension 42, as illustrated in FIG. 7. Following the deposition of the polysilicon layer, an insulation layer is deposited to overlie the polysilicon layer. Photolithographic patterning and anisotropic etching steps are performed to define third insulation cap 76, load-gate electrode 72, and second gate extension 74. Finally, an oxidation process is used to form an oxide layer along the sidewalls of load-gate electrode 72 and second gate extension 74.

Having formed load-gate electrode 72 and second gate extension 74, load transistors 15 and 21 are complete. Load transistor 15, shown in cross-section in FIG. 7, includes, source-drain region 66 and channel region 68 in second thin-film layer 64, and load-gate electrode 72 that is separated from channel region 68 by third gate dielectric layer 70. Node 33 includes the portion of the second gate extension 74 that directly contacts source-drain region 66 of load transistor 15. Second gate extension 74 is electrically coupled to source-drain region 50 of driver transistor 13 and source-drain region 32 of pass transistor 23 through first thin-film layer 36. Thus, an electrical connection is created at node 33 between the gate electrodes of transistors 19 and 21, and the drain regions of transistors 13, 15, and 23, as illustrated in FIG. 1.

As illustrated in FIG. 7, second gate electrode 72 does not completely overlie channel region 68, but, instead, is off-set to one side of the channel. The off-set gate arrangement improves the performance of load transistor 15 by removing the P-N junction away from the edge of load-gate 72. Spacing the junction away from the gate edge reduces the off-current of load transistor 15. As previously described, because of the inverse symmetry of memory cell 10, corresponding transistors, such as load transistor 21, although not shown in the cross-section of FIG. 7-2, are formed concurrently on the opposite side of the memory cell.

Thus it is apparent that there has been provided, in accordance with the invention, a semiconductor memory cell and process for its fabrication which fully meets the advantages set forth above. Although the invention has been described and illustrated with reference to specific illustrative embodiments thereof, it is not intended that the invention be limited to those illustrative embodiments. Those skilled in the art will recognize that variations and modifications can be made without departing from the spirit of the invention. For example, while a preferred method for the formation of load transistors 15 and 21 has been described, those skilled in the art will recognize that other methods can be used to form the load transistors. For example, the P+ implant can be performed after etching to define the source-drain regions of the load transistors. Furthermore, the P+ regions can be formed prior to the formation of the N-type channel region 68. In addition, the load transistors can be fabricated to be vertical devices, or undergated devices, and the like. Moreover, the substrate can be a silicon-on-insulator (SOI) type substrate comprised of an epitaxial layer formed over a buried dielectric layer. It is therefore intended to include within the invention all such variations and modifications as fall within the scope of the appended claims and equivalents thereof.

We claim:

1. A process for fabricating a semiconductor memory cell comprising:

providing a single-crystal semiconductor substrate;

forming first and second parallel opposed wordlines overlying the substrate; and forming first and second cross-coupled thin-film driver transistors overlying the first and second wordlines respectively, wherein each thin-film driver transistor includes a thin-film layer having a source-drain region and a channel region formed therein, and wherein the channel region overlies a portion of the wordline and a portion of the thin-film layer contacts the single-crystal substrate.

2. The process of claim 1, wherein the formation of the thin-film layer comprises:

depositing a silicon layer to overlie the first and second wordlines;

implanting the silicon layer with an element selected from the group consisting of silicon and germanium;

annealing the implanted silicon layer to form single-crystal silicon; and etching the single-crystal silicon to form the thin-film layer.

3. The process of claim 2, wherein the step of annealing the implanted silicon layer comprises exposing the silicon to a coherent light source.

4. The process of claim 2, wherein the step of depositing a silicon layer comprises depositing a material selected from the group consisting of amorphous silicon and polycrystalline silicon.

5. The process of claim 1, wherein the formation of the thin-film layer comprises epitaxially growing a single-crystal silicon layer.

6. The process of claim 1, wherein the formation of the thin-film layer comprises chemical vapor deposition of polysilicon.

7. A process for fabricating a semiconductor memory cell comprising:
   providing a single-crystal substrate having an active region and an isolation region;
   forming a dielectric layer overlying the active region;
   forming first and second wordlines, the first wordline overlying the active region and the second wordline overlying the isolation region;
   forming an opening in the dielectric layer adjacent to the first wordline to expose a portion of the single-crystal substrate;
   forming a single-crystal silicon layer having a first portion overlying the second wordline and a second portion in contact with the single-crystal substrate through the opening in the dielectric layer and a third portion overlying a portion of the first wordline;
   forming a driver-gate electrode overlying the first portion of the single-crystal silicon layer; and
   doping the single-crystal silicon layer to form source and drain regions on opposing sides of the driver-gate electrode.

8. The process of claim 7, wherein the step of forming a single-crystal silicon layer comprises:
   depositing a layer of silicon to overlie the substrate;
   implanting the silicon layer with an element selected from the group consisting of silicon and germanium;
   annealing the implanted silicon layer to form single-crystal silicon; and
   etching the single-crystal silicon to form a patterned thin-film layer.

9. The process of claim 8, wherein the step of depositing a silicon layer comprises depositing a material selected from the group consisting of amorphous silicon and polycrystalline silicon.

10. The process of claim 8, wherein the step of annealing the implanted silicon layer comprises exposing the silicon to a coherent light source.

11. The process of claim 7, wherein the step of forming a single-crystal silicon layer comprises epitaxially growing a single-crystal silicon layer using the exposed portion of the single crystal substrate as a nucleation site.

12. The process of claim 7 further comprising the steps of:
   forming a polysilicon interconnect layer having a first portion overlying and electrically insulated from the single-crystal silicon layer, and having a second portion overlying a portion of the first wordline and electrically insulated from the first wordline, wherein the second portion is separate from the first portion; and
   forming a thin-film transistor overlying and insulated from the second wordline, the thin-film transistor having a second gate electrode overlying a channel region, wherein the second gate electrode and the channel region are aligned with the driver-gate electrode.

* * * * *